United States Patent
Song et al.

(10) Patent No.: US 10,379,978 B2
(45) Date of Patent: Aug. 13, 2019

(54) SEMICONDUCTOR DEVICE AND SYSTEM RELATING TO DATA MAPPING

(71) Applicant: SK hynix Inc., Icheon-si, Gyeonggi-do (KR)

(72) Inventors: Young Ook Song, Icheon-si (KR); Hyun Seok Kim, Icheon-si (KR); Su Hae Woo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 152 days.

(21) Appl. No.: 15/434,936

(22) Filed: Feb. 16, 2017

(65) Prior Publication Data

US 2018/0032415 A1    Feb. 1, 2018

(30) Foreign Application Priority Data

Jul. 26, 2016   (KR) .................... 10-2016-0094711

(51) Int. Cl.
*G06F 11/20*   (2006.01)
*G06F 11/10*   (2006.01)
*G11C 29/52*   (2006.01)
*G11C 29/00*   (2006.01)

(52) U.S. Cl.
CPC ...... *G06F 11/2094* (2013.01); *G06F 11/1068* (2013.01); *G11C 29/52* (2013.01); *G11C 29/76* (2013.01)

(58) Field of Classification Search
CPC ............................ G06F 11/20; G06F 11/2094
USPC ....................................................... 714/6.13
See application file for complete search history.

(56) References Cited

U.S. PATENT DOCUMENTS

| | | | | |
|---|---|---|---|---|
| 5,596,709 A | * | 1/1997 | Bond | G06F 11/1084 714/6.32 |
| 5,880,786 A | * | 3/1999 | Oku | H04N 19/61 348/715 |
| 8,407,394 B2 | * | 3/2013 | Mazzola | G06F 12/06 711/117 |
| 2010/0077267 A1 | * | 3/2010 | Perego | G06F 13/1678 714/716 |
| 2013/0275836 A1 | * | 10/2013 | Inada | G06F 11/1068 714/773 |
| 2015/0127972 A1 | * | 5/2015 | Chun | G06F 11/1008 714/6.13 |
| 2015/0332735 A1 | * | 11/2015 | Chun | G11C 5/147 714/704 |

FOREIGN PATENT DOCUMENTS

| | | |
|---|---|---|
| KR | 1020070096731 A | 10/2007 |
| KR | 1020140067875 A | 6/2014 |
| KR | 1020140125981 A | 10/2014 |

* cited by examiner

*Primary Examiner* — Kamini B Patel
(74) *Attorney, Agent, or Firm* — William Park & Associates Ltd.

(57) ABSTRACT

A semiconductor system may be provided. The semiconductor system may include a fail information generator and a data mapping circuit. The fail information generator may detect a data fail address of a data storage region. The data mapping circuit may change a mapping table based on the data fail address, and transmit data to be stored at the data fail address in the data storage region, to a parity storage region.

6 Claims, 5 Drawing Sheets

SEMICONDUCTOR DEVICE AND SYSTEM RELATING TO DATA MAPPING

CROSS-REFERENCES TO RELATED APPLICATION

The present application claims priority under 35 U.S.C. § 119(a) to Korean application number 10-2016-0094711, filed on Jul. 26, 2016, in the Korean Intellectual Property Office, which is incorporated herein by reference in its entirety.

BACKGROUND

1. Technical Field

Various embodiments may generally relate to a semiconductor technology, and, more particularly, to a semiconductor device and system relating to data mapping.

2. Related Art

A semiconductor system which performs an ECC (error correction code) operation includes a memory device for storing data and parity into memory cells. Typically, when an ECC mode is enabled, the memory device receives data and parity from a memory controller, and stores the data and the parity therein. As the data storage region of the memory device is increased, a parity storage region should be increased in proportion thereto. While the memory device includes a storage region capable of storing a predetermined capacity of parity, because a storage region for storing ECC parity may not be utilized fully depending on an application, there may be a case where the storage region is not utilized efficiently.

SUMMARY

In an embodiment, a semiconductor system may be provided. The semiconductor device may include a fail information generator configured to detect a data fail address of a data storage region. The semiconductor device may include a data mapping circuit configured to change a mapping table based on the data fail address, and transmit data to be stored at the data fail address in the data storage region, to a parity storage region.

In an embodiment, a semiconductor system may include a fail information generator configured to detect a data fail address of a data storage region. The semiconductor device may include a mapping table logic configured to change a mapping table based on the data fail address. The semiconductor device may include a data mapper configured to transmit data to be stored at the data fail address, to a parity storage region, based on the mapping table. The semiconductor device may include a read and write (read/write) controller configured to control a time at which the mapping table logic provides a value of the mapping table to the data mapper, based on a command signal and an address.

In an embodiment, a semiconductor system may include a controller. The semiconductor system may include a memory including a data storage region in which data are stored and a parity storage region in which parity are stored. The controller may include a fail information generator configured to detect a data fail address of the data storage region. The semiconductor system may include a data mapping circuit configured to change a mapping table based on the data fail address, and transmit data to be stored at the data fail address in the data storage region, to the parity storage region.

DETAILED DESCRIPTION

Hereinafter, semiconductor devices and systems for performing data mapping will be described below with reference to the accompanying drawings through various examples of embodiments.

Figure 1:
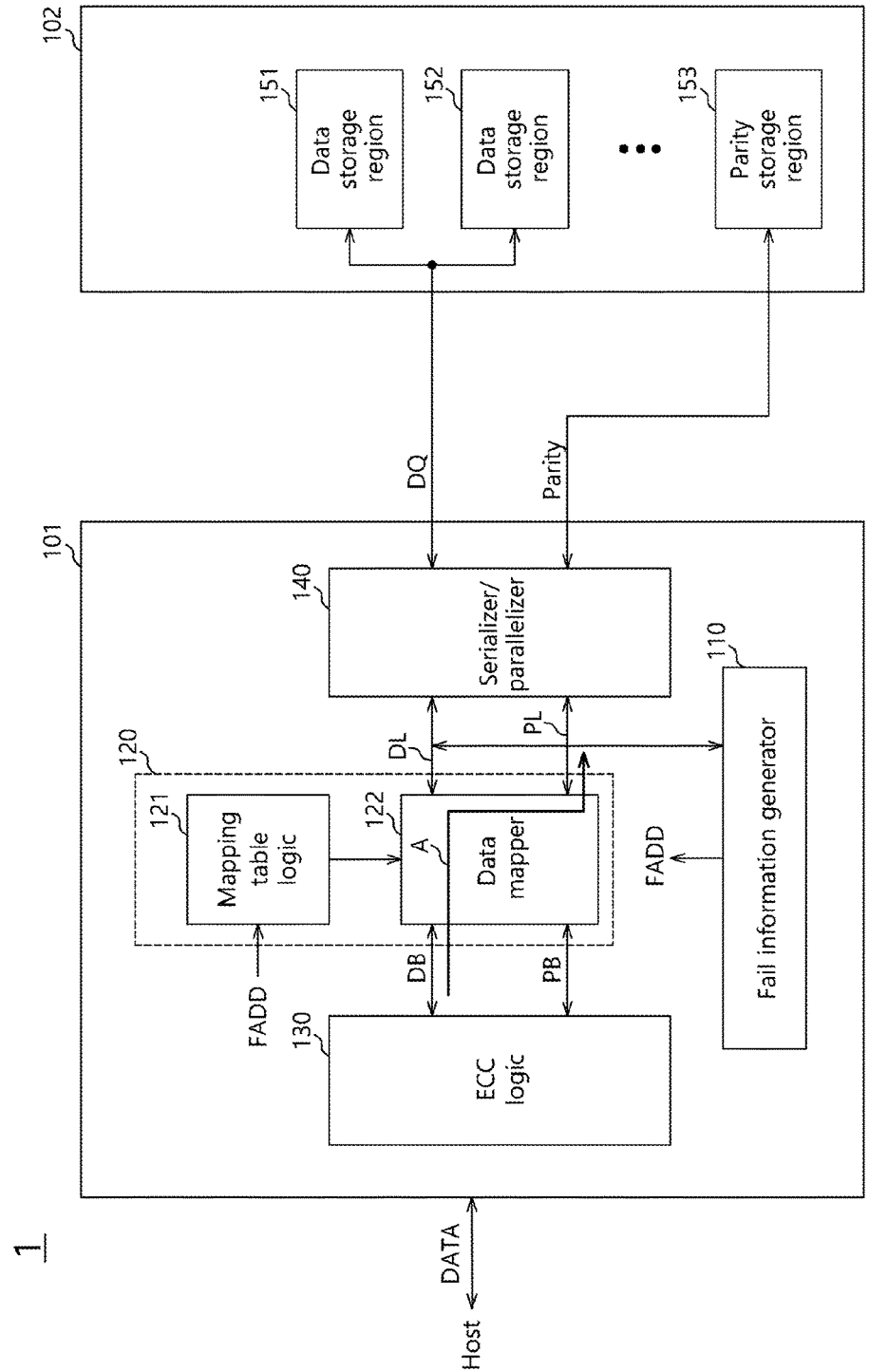
FIG. 1 is a diagram illustrating a representation of an example of the configuration of a semiconductor system in accordance with an embodiment.

FIG. 1 is illustrates a representation of an example of the configuration of a semiconductor system 1 in accordance with an embodiment. Referring to FIG. 1, the semiconductor system 1 may include a memory controller 101 and a memory device 102. The memory controller 101 may control the memory device 102 to read the data stored in the memory device 102 or store data in the memory device 102 in response to a read and write (read/write) request from a host. The host may include a central processing unit (CPU), a graphic processing unit (GPU), a multimedia processor (MMP) or a digital signal processor (DSP). The memory device 102 may include a volatile memory and a nonvolatile memory. The volatile memory may include an SRAM (static RAM), a DRAM (dynamic RAM) or an SDRAM (synchronous DRAM), and the nonvolatile memory may include a ROM (read only memory), a PROM (programmable ROM), an EPROM (electrically programmable ROM), an EEPROM (electrically erasable and programmable ROM), a flash memory, a PRAM (phase change RAM), an MRAM (magnetic RAM), an ReRAM (resistive RAM) or an FRAM (ferroelectric RAM).

The memory controller 101 may include a fail information generator 110 and a data mapping circuit 120. The fail information generator 110 may detect a data fail address FADD of data storage regions 151 and 152 and transfer the data fail address FADD to the data mapping circuit 120. The fail information generator 110 may be coupled with a data transmission path between the data mapping circuit 120 and the memory device 102. By being coupled with the data transmission path, the fail information generator 110 may perform various tests for the memory device 102. A representative example of the fail information generator 110 is a BIST (built-in self-test) circuit. When using the BIST circuit, although a disadvantage may be encountered in that a circuit area increases, advantages may be provided in that various complicated tests may be performed within a short time without using external test equipment. The data mapping circuit 120 may change a mapping table based on the data fail address FADD transferred from the fail information generator 110, and may transmit data DQ to be stored at the data fail address FADD in the data storage regions 151 and 152, to a parity storage region 153. For example, the data mapping circuit 120 may change a mapping table based on the data fail address FADD, and rather than transmitting data to be stored at the data fail address in the data storage region 151 and 152, transmitting the data to a parity storage region 153 instead.

The data mapping circuit 120 may include a mapping table logic 121 and a data mapper 122. The mapping table logic 121 may include information corresponding to the addresses of the data storage regions 151 and 152 and the addresses of the parity storage region 153. The mapping table logic 121 may change the mapping table including the information corresponding to the addresses of the data storage regions 151 and 152 and the addresses of the parity storage region 153, based on the data fail address FADD transferred from the fail information generator 110. In an embodiment, the mapping table logic 121 may change a value of the mapping table including the information corresponding to the addresses of the data storage regions 151 and 152 and the addresses of the parity storage region 153, based on the data fail address FADD transferred from the fail information generator 110.

The data mapper 122 may transmit data DQ and parity Parity to a data transmission path DL and a parity transmission path PL based on the mapping table of the mapping table logic 121. The data mapper 122 may change the data transmission path DL through which data DQ to be stored at the data fail address FADD of the data storage regions 151 and 152 is to be transmitted, to the parity transmission path PL which is coupled with the parity storage region 153, based on the changed mapping table, as indicated by the reference symbol A. Accordingly, data DQ to be stored at the data fail address FADD may be stored in a space which does not store parity Parity, in the parity storage region 153. In an embodiment, the data DQ to be sorted at the data fail address FADD may be stored in a separate space within the parity storage region which parity Parity is not stored in. In an embodiment, the data DQ to be stored at the data fail address FADD may be stored in a memory cell at which a prior parity Parity is not already stored at or an available space (or i.e., memory cell) to store the parity Parity at of which the prior parity Parity can be removed or erased, in the parity storage region.

The memory device 102 may include a plurality of memory chips. In an embodiment, each of the memory chips may include the plurality of data storage regions 151 and 152 for storing data DQ and the parity storage region 153 for storing parity Parity. In an embodiment, the memory device 102 may use one memory chip among a plurality of memory chips, as a memory chip for storing parity Parity, and use the remaining memory chips as memory chips for storing data DQ. The memory device 102 may store the data DQ and the parity Parity transmitted from the memory controller 101. The data DQ and the parity Parity stored in the memory device 102 may be transmitted from the data mapper 122 based on the mapping table included in the mapping table logic 121. The parity Parity may have capacity smaller than the data DQ, and the area and capacity of the plurality of data storage regions 151 and 152 may be larger than the area and capacity of the parity storage region 153.

The memory controller 101 may further include an error correction code (ECC) logic 130 and a serializer and parallelizer (serializer/parallelizer) 140. The ECC logic 130 may encode data DATA received from the host, and generate a data bit DB and a parity bit PB to be transmitted to the data mapper 122. In an embodiment, the ECC logic 130 may encode data DATA received from a device located externally from the semiconductor system, and generate a data bit DB and a parity bit PB to be transmitted to the data mapper 122. The ECC logic 130 may decode a data bit DB and a parity bit PB received from the data mapper 122, and generate data DATA to be transmitted to the host. In an embodiment, the ECC logic 130 may decode a data bit DB and a parity bit PB received from the data mapper 122, and generate data DATA to be transmitted to a device located externally from the semiconductor system 1. The serializer/parallelizer 140 may serialize the data DQ and the parity Parity transmitted from the data mapper 122, and transmit them to the data storage regions 151 and 152 and the parity storage region 153. The serializer/parallelizer 140 may parallelize the data DQ and the parity Parity transmitted from the data storage regions 151 and 152 and the parity storage region 153, and transmit them to the data mapper 122.

The ECC logic 130 may encode the data DATA transmitted from the host, and generate the data bit DB and the parity bit PB. The data bit DB and the parity bit PB generated in the ECC logic 130 may be transmitted to the data mapper 122. The data mapper 122 may transmit the data bit DB and the parity bit PB received from the ECC logic 130, as the data DQ and the parity Parity. The data mapper 122 may output the data DQ and the parity Parity to the data transmission path DL and the parity transmission path PL based on the mapping table of the mapping table logic 121. The serializer/parallelizer 140 may serialize the data DQ and the parity Parity received from the data mapper 122, and transmit them to the data storage regions 151 and 152 and the parity storage region 153.

The operation of the semiconductor system 1 in accordance with an embodiment will be described below with reference to FIG. 1. The data fail address FADD of the data storage regions 151 and 152 may be detected by the fail information generator 110. The fail information generator 110 may detect the data fail address FADD associated with a memory cell in which a fail exists, among the memory cells of the data storage regions 151 and 152, through a test. The data fail address FADD detected by the fail information generator 110 may be transmitted to the mapping table logic 121. The mapping table logic 121 may change the mapping table including the information corresponding to the addresses of the data storage regions 151 and 152 and the addresses of the parity storage region 153, according to the data fail address FADD. The data fail address FADD may be replaced with any one among the addresses of the parity storage region 153. The any one among the addresses of the parity storage region 153 may be an address at which parity Parity is not already stored, in the parity storage region 153. In an embodiment, the any one among the addresses of the parity storage region 153 may be an address at which a prior parity Parity is not already stored at or an available space (or i.e., memory cell) to store the parity Parity at of which the prior parity Parity can be removed or erased, in the parity storage region 153. The data mapper 122 may transmit the data bit DB and the parity bit PB received from the ECC logic 130, as the data DQ and the parity Parity. The data mapper 122 may change the data transmission path DL through which data DQ to be stored at the data fail address FADD is to be transmitted, to the parity transmission path PL, based on the changed mapping table of the mapping table logic 121, as indicated by the reference symbol A. The serializer/parallelizer 140 may serialize the data DQ and the parity Parity received from the data mapper 122. Thus, data DQ to be stored at an address associated with a memory cell in which a fail does not exist, among the memory cells of the data storage regions 151 and 152, may be transmitted to and stored in the data storage regions 151 and 152. Data DQ to be stored at the data fail address FADD may not be transmitted to the data storage regions 151 and 152, and may be transmitted to and stored in the parity storage region 153.

Figure 2:
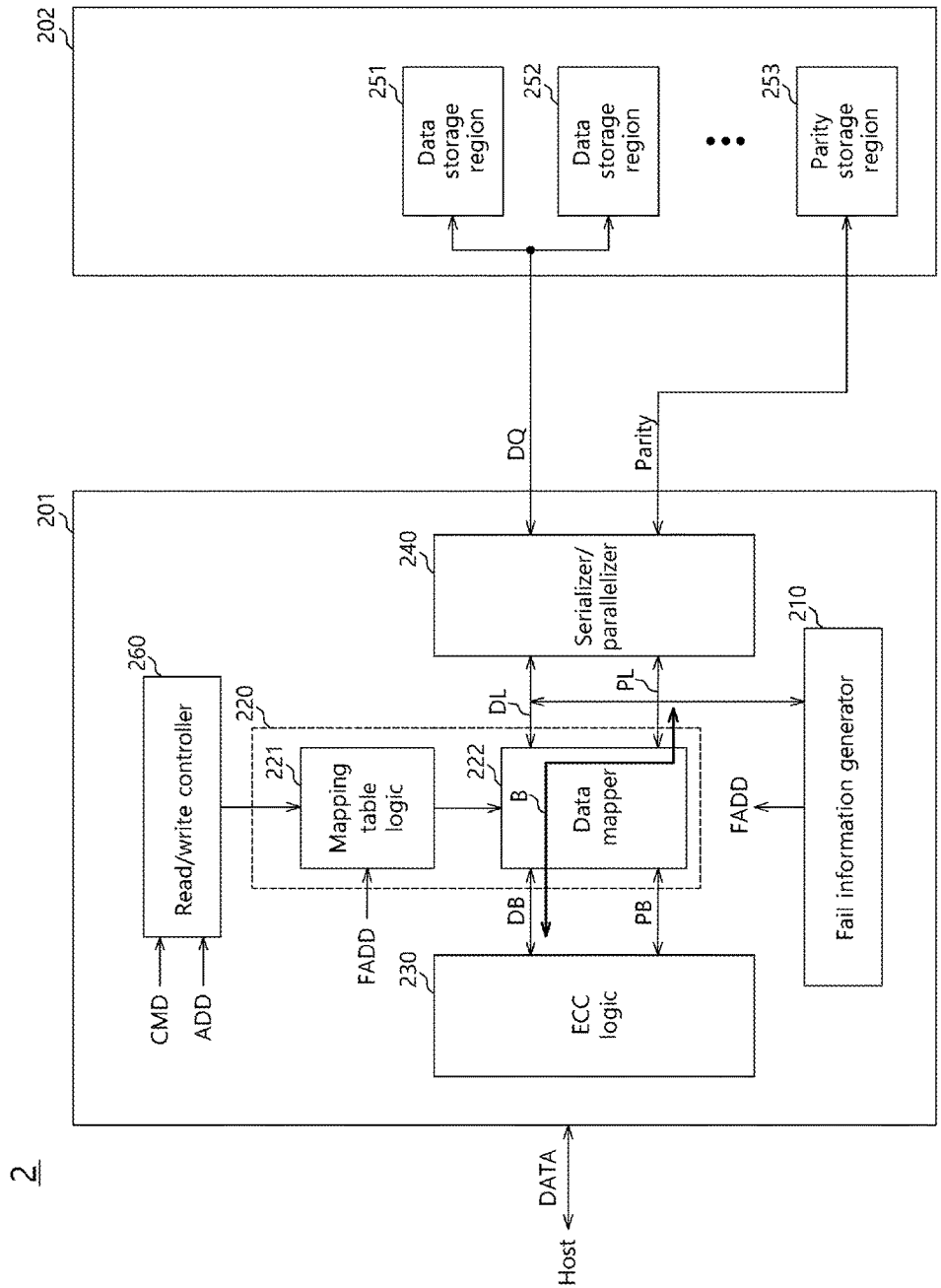
FIG. 2 is a diagram illustrating a representation of an example of the configuration of a semiconductor system in accordance with an embodiment.

FIG. 2 is a diagram illustrating a representation of an example of the configuration of a semiconductor system 2 in accordance with an embodiment. Referring to FIG. 2, the semiconductor system 2 may include a memory controller 201 and a memory device 202.

The memory controller 201 may include a fail information generator 210, a data mapping circuit 220, and a read/write controller 260. The data mapping circuit 220 may include a mapping table logic 221 and a data mapper 222. The fail information generator 210 may detect a data fail address FADD of data storage regions 251 and 252 and transfer the data fail address FADD to the mapping table logic 221. The fail information generator 210 may be coupled with a data transmission path between the data mapper 222 and the memory device 202. By being coupled with the data transmission path, the fail information generator 210 may perform various tests for the memory device 202. The mapping table logic 221 may include information corresponding to the addresses of the data storage regions 251 and 252 and the addresses of a parity storage region 253. The mapping table logic 221 may change a mapping table including the information corresponding to the addresses of the data storage regions 251 and 252 and the addresses of the parity storage region 253, based on the data fail address FADD transferred from the fail information generator 210.

The data mapper 222 may replace the data fail address FADD with an address of the parity storage region 253, and change the mapping table according to a replacement result. After the mapping table is changed, a data transmission path DL through which data DQ to be stored at the data fail address FADD of the data storage regions 251 and 252 is to be transmitted, may be changed to a parity transmission path PL of the parity storage region 253, based on the changed mapping table. Accordingly, data DQ to be stored at the data fail address FADD may be stored in a space which does not store parity Parity, in the parity storage region 253.

The read/write controller 260 may control a point of time at which the mapping table logic 221 provides the value of the mapping table to the data mapper 222, based on a command signal CMD and an address ADD. In a write operation, the read/write controller 260 may cause the value of the mapping table to be provided to the data mapper 222 after a time corresponding to a write latency passes, based on the command signal CMD and the address ADD. In a read operation, the read/write controller 260 may cause the value of the mapping table to be provided to the data mapper 222 after a time corresponding to a read latency passes, based on the command signal CMD and the address ADD. The write latency may mean a delay time to a point of time at which data DQ is actually transmitted from the memory controller 201 to the memory device 202, after the command signal CMD for the write operation is transmitted to the memory device 202. The read latency may mean a delay time to a point of time at which data DQ is actually transmitted from the memory device 202 to the memory controller 201, after the command signal CMD for the read operation is transmitted. Since the read/write controller 260 causes the value of the mapping table to be provided to the data mapper 222 at an appropriate point of time according to the operation of the semiconductor system 2, the data mapper 222 may change the data transmission path DL and the parity transmission path PL at a precise point of time.

In the case where the address ADD includes the data fail address FADD, the read/write controller 260 may control a point of time at which the value of the changed mapping table is provided to the data mapper 222. In a write operation, in the case where the address ADD includes the data fail address FADD, the read/write controller 260 may cause the value of the changed mapping table to be provided to the data mapper 222 after a time corresponding to a write latency passes, based on the command signal CMD and the address ADD. In a read operation, in the case where the address ADD includes the data fail address FADD, the read/write controller 260 may cause the value of the changed mapping table to be provided to the data mapper 222 after a time corresponding to a read latency passes, based on the command signal CMD and the address ADD.

The memory device 202 may include a plurality of memory chips. In an embodiment, each of the memory chips may include the plurality of data storage regions 251 and 252 for storing data DQ and the parity storage region 253 for storing parity Parity. In an embodiment, the memory device 202 may use one memory chip among a plurality of memory chips, as a memory chip for storing parity Parity, and use the remaining memory chips as memory chips for storing data DQ. In a write operation, the memory device 202 may store the data DQ and the parity Parity transmitted from the memory controller 201. The data DQ and the parity Parity stored in the memory device 202 may be transmitted from the data mapper 222 based on the mapping table included in the mapping table logic 221. In the case where the address ADD includes the data fail address FADD, the data mapper 222 may transmit data DQ to be transmitted through the data transmission path DL, through the parity transmission path PL, based on the value of the changed mapping table. In a read operation, the data DQ and the parity Parity stored in the memory device 202 may be transmitted to the memory controller 201. The data DQ and the parity Parity transmitted from the memory device 202 are provided to the data mapper 222, and the data mapper 222 may generate a data bit DB and a parity bit PB from the data DQ and the parity Parity, based on the mapping table included in the mapping table logic 221. In the case where the address ADD includes the data fail address FADD, the data mapper 222 may output the parity Parity transmitted through the parity transmission path PL, as the data bit DB, based on the changed mapping table. Therefore, the data stored in the parity storage region 253 in place of the data stored in the data storage regions 251 and 252 may be provided as the data bit DB, and may be outputted normally to a host through an ECC logic 230.

The memory controller 201 may further include the ECC logic 230 and a serializer/parallelizer 240. The ECC logic 230 may encode data DATA received from the host, and generate a data bit DB and a parity bit PB to be transmitted to the data mapper 222. In an embodiment, the ECC logic 230 may encode data DATA received from a device located externally from the semiconductor system 2, and generate a data bit DB and a parity bit PB to be transmitted to the data mapper 222. The ECC logic 230 may decode a data bit DB and a parity bit PB received from the data mapper 222, and generate data DATA to be transmitted to the host. In an embodiment, the ECC logic 230 may decode a data bit DB and a parity bit PB received from the data mapper 222, and generate data DATA to be transmitted to a device located externally from the semiconductor system 2. The serializer/parallelizer 240 may serialize the data DQ and the parity Parity transmitted from the data mapper 222, and input them to the data storage regions 251 and 252 and the parity storage region 253. The serializer/parallelizer 240 may parallelize the data DQ and the parity Parity outputted from the data storage regions 251 and 252 and the parity storage region 253, and transmit them to the data mapper 222.

The ECC logic 230 may encode the data DATA transmitted from the host, and generate the data bit DB and the parity bit PB. The data bit DB and the parity bit PB generated in the ECC logic 230 may be transmitted to the data mapper 222.

The data mapper 222 may transmit the data bit DB and the parity bit PB received from the ECC logic 230, as the data DQ and the parity Parity. The data mapper 222 may output the data DQ and the parity Parity to the data transmission path DL and the parity transmission path PL based on the mapping table of the mapping table logic 221. The serializer/parallelizer 240 may serialize the data DQ and the parity Parity received from the data mapper 222, and transmit them to the data storage regions 251 and 252 and the parity storage region 253.

The operation of the semiconductor system 2 in accordance with an embodiment will be described below with reference to FIG. 2. The fail information generator 210 may detect the data fail address FADD associated with a memory cell in which a fail exists, among the memory cells of the data storage regions 251 and 252, through a test. The data fail address FADD detected by the fail information generator 210 may be transmitted to the mapping table logic 221. The mapping table logic 221 may change the mapping table including the information corresponding to the addresses of the data storage regions 251 and 252 and the addresses of the parity storage region 253, according to the data fail address FADD. The data fail address FADD may be replaced with any one among the addresses of the parity storage region 253. The any one among the addresses of the parity storage region 253 may be an address at which parity Parity is not stored, in the parity storage region 253.

In a write operation, in the case where the address ADD includes the data fail address FADD, the read/write controller 260 may cause the value of the changed mapping table to be provided to the data mapper 222 after a time corresponding to a write latency passes, based on the command signal CMD and the address ADD. The data mapper 222 may change the data transmission path DL through which data DQ to be stored at the data fail address FADD is to be transmitted, to the parity transmission path PL, based on the changed mapping table of the mapping table logic 221, as indicated by the reference symbol B. The serializer/parallelizer 240 may serialize the data DQ and the parity Parity received from the data mapper 222. Thus, data DQ to be stored at an address associated with a memory cell in which a fail does not exist, among the memory cells of the data storage regions 251 and 252, may be transmitted through the data transmission path DL to and stored in the data storage regions 251 and 252. Conversely, data DQ to be stored at the data fail address FADD may not be transmitted to the data storage regions 251 and 252, and may be transmitted through the parity transmission path PL to and stored in the parity storage region 253.

In a read operation, in the case where the address ADD includes the data fail address FADD, the read/write controller 260 may cause the value of the changed mapping table to be provided to the data mapper 222 after a time corresponding to a read latency passes, based on the command signal CMD and the address ADD. The serializer/parallelizer 240 may parallelize the data DQ and the parity Parity outputted from the data storage regions 251 and 252 and the parity storage region 253, and provide them to the data mapper 222. The data mapper 222 may receive the data DQ and the parity Parity from the serializer/parallelizer 240. The data mapper 222 may output the parity Parity transmitted through the parity transmission path PL, as the data bit DB, based on the changed mapping table, as indicated by the reference symbol B. The ECC logic 230 may decode the data bit DB and the parity bit PB received from the data mapper 222, and generate data DATA to be transmitted to the host.

Figure 3:
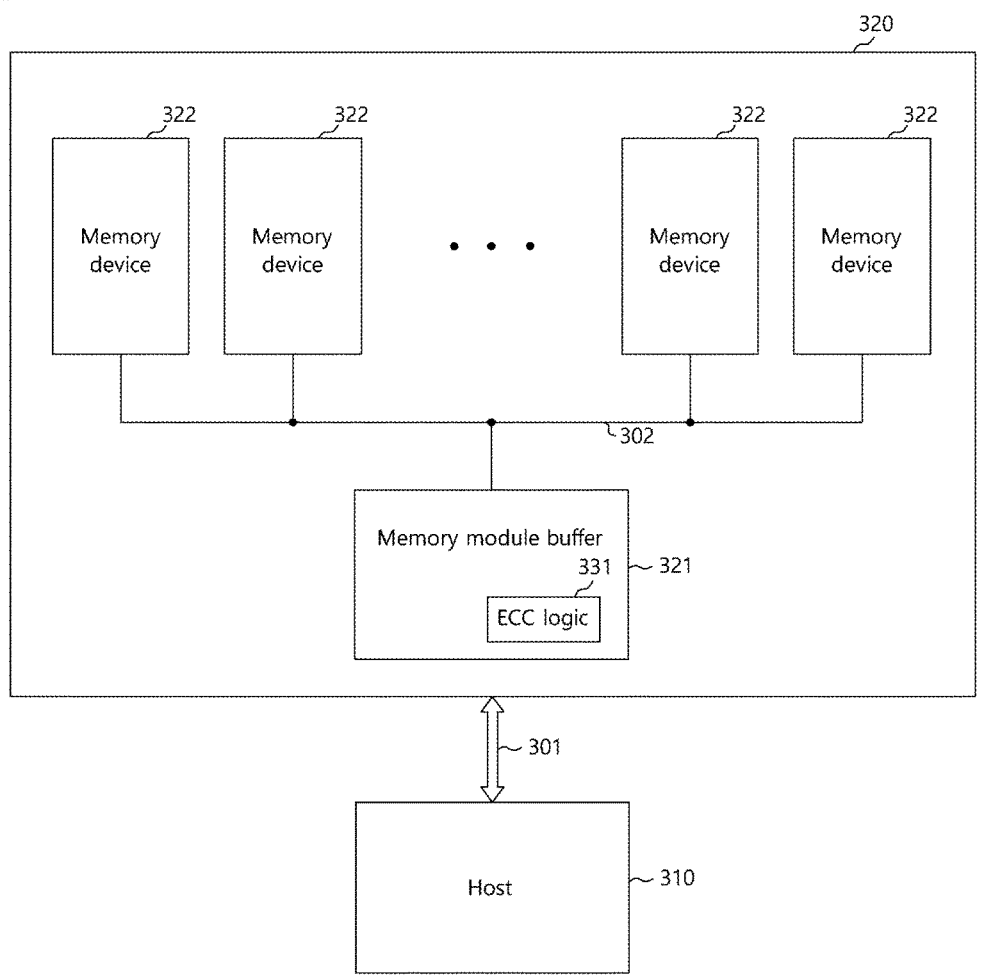
FIG. 3 is a diagram illustrating, for example, a representation of the configuration of a semiconductor system in accordance with an embodiment.

FIG. 3 is a diagram illustrating a representation of an example of the configuration of a semiconductor system 3 in accordance with an embodiment. Referring to FIG. 3, the semiconductor system 3 may include a host 310 and a memory module 320. The host 310 and the memory module 320 may perform data communication by being coupled with each other through a plurality of buses including an external data bus 301. The memory module 320 may include a memory module buffer 321 and a plurality of memory devices 322. The memory module buffer 321 may relay the signals transmitted between the host 310 and the plurality of memory devices 322. The memory module buffer 321 may be coupled with the plurality of memory devices 322 through an internal data bus 302. The data bandwidth of the external data bus 301 may be different from the data bandwidth of the internal data bus 302. Also, the data bandwidth of the internal data bus 302 may be different from the data bandwidth of data transmission lines in the memory devices 322. In an embodiment, the memory module 320 may include a UDIMM (un-buffered dual in-line memory module), a DIMM (dual in-line memory module), an SODIMM (small outline dual in-line memory module), an RDIMM (registered dual in-line memory module) or an LRDIMM (load-reduced dual in-line memory module).

The memory module buffer 321 may include various logic circuits which allow the host 310 and the plurality of memory devices 322 to communicate reliably. The memory module buffer 321 may be an advanced memory buffer including various logic circuits. The memory module buffer 321 may include an ECC logic 331, and perform an ECC operation.

Referring to FIG. 3, at least any one among the plurality of memory devices 322 may be a parity storage region which stores parity. The remaining memory devices among the plurality of memory devices 322 may be data storage regions which store data. The plurality of memory devices 322 may correspond to the data storage regions 151, 152, 251 and 252 and the parity storage regions 153 and 253 illustrated in FIGS. 1 and 2. The controllers 101 and 201 illustrated in FIGS. 1 and 2 may be applied as the memory module buffer 321.

Figure 4:
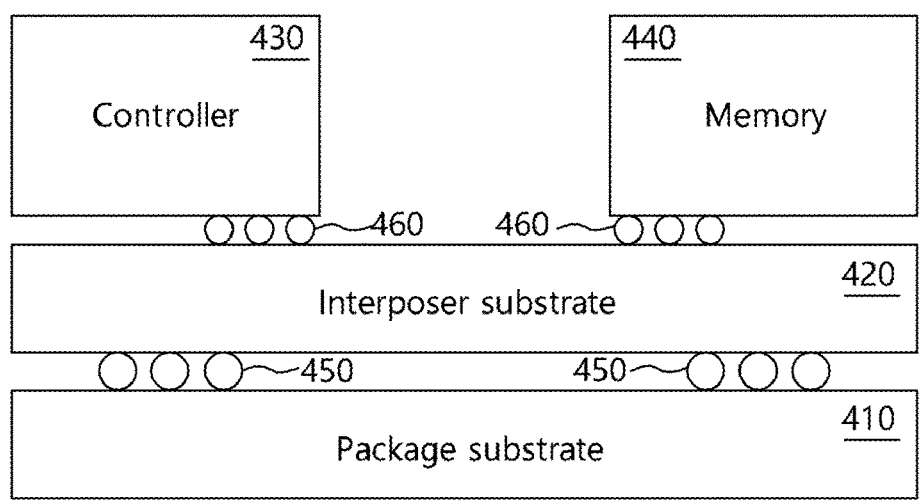
FIG. 4 is a diagram illustrating, for example, a representation of the configuration of a semiconductor system in accordance with an embodiment.

FIG. 4 is a diagram illustrating a representation of an example of the configuration of a semiconductor system 4 in accordance with an embodiment. Referring to FIG. 4, the semiconductor system 4 in accordance with an embodiment may include a package substrate 410, an interposer substrate 420, a controller 430, and a memory 440. The interposer substrate 420 may be stacked on the package substrate 410. The interposer substrate 420 and the package substrate 410 may be coupled with each other through electrical coupling means 450 such as bump balls, a ball grid array and C4 bumps. Signal paths for transmitting signals may be formed in the interposer substrate 420 and the package substrate 410. While not illustrated, the package substrate 410 may include package balls, and the semiconductor system 4 may be coupled with an external electronic device through the package balls.

The controller 430 and the memory 440 may be stacked on the interposer substrate 420, and may be coupled with the interposer substrate 420 through micro bumps 460. The controller 430 may communicate with the memory 440 through the signal paths formed in the interposer substrate 420. The components of the semiconductor system 4 may be packaged into a single package, and may be realized in the form of a system-on-chip (SoC), a system-in-package (SiP), a multi-chip package or a flip chip package.

The controller 430 may be a master device which controls the memory 440. The controller 430 may be a central processing unit (CPU), a graphic processing unit (GPU), a digital signal processor (DSP), an application processor (AP), a controller chip, or a memory controller chip.

The memory 440 may be a slave device which is controlled by the controller 430. The memory 430 may be a volatile memory device such as a DRAM or may be a nonvolatile memory device such as a flash memory device, a phase change random access memory (PCRAM), a resistive random access memory (ReRAM), a ferroelectric random access memory (FeRAM), a magnetic random access memory (MRAM) and a spin transfer torque random access memory (STTRAM). Otherwise, the memory 440 may be configured by a combination of at least two among volatile memories and nonvolatile memories. In an embodiment, the memory 440 may be a stacked memory device which includes a plurality of chips. The controller 430 may include an ECC logic, and perform an ECC operation. At least one chip among a plurality of chips configuring the memory 440 may be a parity storage region for storing parity. The remaining chips among the plurality of chips may be data storage regions for storing data. The plurality of chips may correspond to the data storage regions 151, 152, 251 and 252 and the parity storage regions 153 and 253 illustrated in FIGS. 1 and 2. The controllers 101 and 201 illustrated in FIGS. 1 and 2 may be applied as the controller 430.

Figure 5:
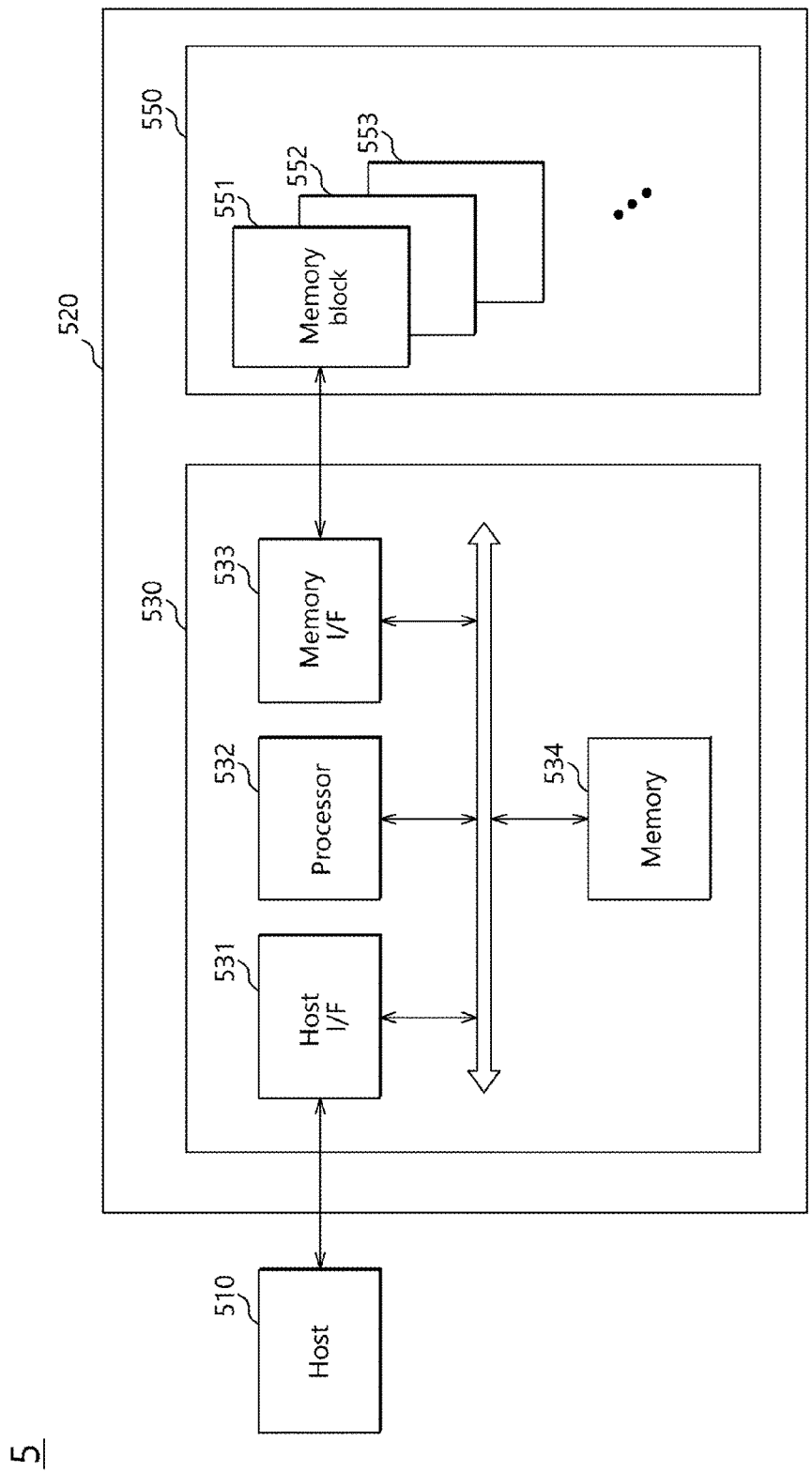
FIG. 5 is a diagram illustrating, for example, a representation of the configuration of a data processing system in accordance with an embodiment.

FIG. 5 is a diagram illustrating, for example, a representation of an example of a data processing system 5 in accordance with an embodiment. Referring to FIG. 5, the data processing system 5 may include a host 510 and a data storage device 520. The data storage device 520 may operate in response to a request from the host 510, in particular, store data to be accessed by the host 510. The data storage device 520 may be used as the main memory system or the auxiliary memory system of the host 510. The data storage device 520 may be realized as any one among various kinds of storage devices according to the protocol of a host interface which is electrically coupled with the host 510. The data storage device 520 may be realized as any one among various kinds of storage devices such as a solid state drive (SSD), a multimedia card in the form of an MMC, an embedded MMC (eMMC), a reduced-size MMC (RS-MMC) and a micro-MMC, a secure digital card in the form of an SD, a mini-SD card and a micro-SD, a universal serial bus (USB) storage device, a universal flash storage (UFS) device, a compact flash (CF) card, a smart media (SM) card and a memory stick.

The data storage device 520 may be realized as a volatile memory such as a dynamic random access memory (DRAM) and a static random access memory (SRAM) or a nonvolatile memory such as a read only memory (ROM), a mask ROM (MROM), a programmable ROM (PROM), an electrically programmable ROM (EPROM), an electrically erasable and programmable ROM (EEPROM), a ferroelectric random access memory (FRAM), a phase change RAM (PRAM), a magnetic RAM (MRAM) and a resistive RAM (ReRAM).

The data storage device 520 may include a memory device 550 which stores data to be accessed by the host 510 and a controller 530 which controls storage of data in the memory device 550. The controller 530 and the memory device 550 may be integrated in one semiconductor device. For example, the controller 530 and the memory device 550 may be integrated in one semiconductor device and configure a solid state drive (SSD).

The controller 530 and the memory device 550 may be integrated in one semiconductor device and configure a memory card. The controller 530 and the memory device 550 may be integrated in one semiconductor device, and configure a memory card such as a Personal Computer Memory Card International Association (PCMCIA) card, a compact flash (CF) card, a smart media card (SMC), a memory stick, a multimedia card in the form of an MMC, an RS-MMC and a micro-MMC, a secure digital card in the form of an SD, a mini-SD, a micro-SD and an SDHC, and a universal flash storage (UFS) device.

In an example, the data storage device 520 may configure a computer, an UMPC (ultra-mobile PC), a workstation, a netbook, a PDA (personal digital assistant), a portable computer, a web tablet, a tablet computer, a wireless phone, a portable phone, a smart phone, an e-book, a PMP (portable multimedia player), a portable game player, a navigation device, a black box, a digital camera, a DMB (digital multimedia broadcasting) player, a 3D (three-dimensional) television, a smart television, a digital audio recorder, a digital audio player, a digital image recorder, a digital image player, a digital video recorder, a digital video player, a storage device forming a data center, a device capable of transmitting and receiving information under a wireless environment, one of various electronic devices forming a home network, one of various electronic devices forming a computer network, one of various electronic devices forming a telematics network, an RFID (radio-frequency identification) device, or one of various component parts forming a computing system.

The memory device 550 of the data storage device 520 may retain the data stored therein when power supply is cut off. In particular, the memory device 550 of the data storage device 520 may store the data provided from the host 510 during a write operation, and provide the data stored therein to the host 510 during a read operation. The memory device 550 may include a plurality of memory blocks 551, 552, 553, . . . . The memory device 550 may be a nonvolatile memory device, for example, a flash memory. The flash memory may have a 3D (three-dimensional) stack structure.

The controller 530 of the data storage device 520 may control the memory device 550 in response to a request from the host 510. The controller 530 may provide the data read from the memory device 550, to the host 510, and store the data provided from the host 510, in the memory device 550. To this end, the controller 530 may control overall operations of the memory device 550, such as read, write, program and erase operations.

For example, the controller 530 may include a host interface (I/F) 531, a processor 532, a memory interface 533, and a memory 534. The host interface 531 may process a command and data which are provided from the host 510, and may communicate with the host 510 through at least one among various interface protocols such as universal serial bus (USB), multimedia card (MMC), PCI-E (peripheral component interconnection express), SAS (serial attached SCSI), SATA (serial advanced technology attachment), PATA (parallel advanced technology attachment), SCSI (small computer system interface), ESDI (enhanced small disk interface), and IDE (integrated drive electronics).

The processor 532 may control a write operation or a read operation for the memory device 550 in response to a write request or a read request from the host 510 and overall operations of the data storage device 520. The processor 532 may drive a firmware such as an FTL (flash translation layer) in order to control the overall operations of the data storage device 520. The processor 532 may be realized as a microprocessor or a central processing unit (CPU). The processor 532 may include an ECC logic for detecting an error in the data read from the memory device 550 and storing the error during a read operation, or perform an ECC function. Furthermore, the processor 532 may include a power management unit capable of supplying and managing power for the components included in the controller 530, or perform a power management function.

At least one memory block or at least a portion of one memory block among the plurality of memory blocks 551, 552, 553, . . . of the memory device 550 may be a parity storage region for storing parity generated from the ECC logic of the processor 532. The remaining memory blocks among the plurality of memory blocks 551, 552, 553, . . . may be data storage regions for storing data. The plurality of memory blocks 551, 552, 553, . . . may correspond to the data storage regions 151, 152, 251 and 252 and the parity storage regions 153 and 253 illustrated in FIGS. 1 and 2. The controllers 101 and 102 illustrated in FIGS. 1 and 2 may be applied as the controller 530.

The memory interface 533 may serve as an interface between the controller 530 and the memory device 550 to allow the controller 530 to control the memory device 550 in response to a request from the host 510. The memory interface 533 may generate a control signal for the memory device 550, and process data under control of the processor 532. The memory device 550 may be a flash memory such as NAND flash memory, and the memory interface 533 may generate a control signal for the NAND flash memory and process data under control of the processor 532.

The memory 534 may serve as the working memory of the controller 530 and the data storage device 520, and store data for driving the controller 530 and the data storage device 520. When the controller 530 controls the operation of the memory device 550, the memory 534 may store data which are used by the memory device 550 and the controller 530 for read, write, program, and erase operations.

The memory 534 may be realized by a volatile memory. The memory 534 may be realized by an SRAM or a DRAM. As described above, the memory 534 may store data which are used by the host 510 and the memory device 550 for read and write operations. In order to store data, the memory 534 may include a program memory, a data memory, a write buffer, a read buffer, and a map buffer.

While various embodiments have been described above, it will be understood to those skilled in the art that the embodiments described are examples only. Accordingly, the semiconductor device and system for performing data mapping described herein should not be limited based on the described embodiments.

What is claimed is:

1. A semiconductor system comprising:
   a fail information generator configured to detect a data fail address of a data storage region;
   a mapping table logic configured to change a mapping table based on the data fail address;
   a data mapper configured to transmit data to be stored at the data fail address, to a parity storage region, based on the mapping table; and
   a read and write (read/write) controller configured to causes a value of the mapping table to be provided to the data mapper after a time corresponding to one of a write latency and a read latency passes, based on a command signal and an address.

2. The semiconductor system according to claim 1, wherein the mapping table logic includes information corresponding to addresses of the data storage region and addresses of the parity storage region, and changes information corresponding to the data fail address.

3. The semiconductor system according to claim 1, wherein the data mapper changes a data transmission path to a parity transmission path according to a changed mapping table.

4. The semiconductor system according to claim 1,
   wherein, in a write operation, the read/write controller causes the value of the mapping table to be provided to the data mapper after the time corresponding to the write latency passes, based on the command signal and the address, and
   wherein, in a read operation, the read/write controller causes the value of the mapping table to be provided to the data mapper after the time corresponding to the read latency passes, based on the command signal and the address.

5. The semiconductor system according to claim 4, wherein the read/write controller causes a value of the changed mapping table to be provided to the data mapper, based on the address including the data fail address.

6. The semiconductor system according to claim 1, further comprising:
   an error correction code (ECC) logic configured to encode data received externally from the semiconductor system and generate a data bit and a parity bit to be transmitted to the data mapper, or decode a data bit and a parity bit received from the data mapper and generate data to be transmitted to an exterior of the semiconductor system; and
   a serializer and parallelizer (serializer/parallelizer) configured to serialize data and parity outputted from the data mapper and provide the data and the parity outputted from the data mapper to the data storage region and the parity storage region, or parallelize data and parity outputted from the data storage region and the parity storage region and provide the data and the parity outputted from the data storage region to the data mapper.

\* \* \* \* \*